United States Patent
Jingu

(10) Patent No.: US 11,368,129 B2
(45) Date of Patent: Jun. 21, 2022

(54) AMPLIFIER CIRCUIT

(71) Applicant: Sony Semiconductor Solutions Corporation, Kanagawa (JP)

(72) Inventor: Yoshikatsu Jingu, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/052,373

(22) PCT Filed: Feb. 1, 2019

(86) PCT No.: PCT/JP2019/003596
§ 371 (c)(1),
(2) Date: Nov. 2, 2020

(87) PCT Pub. No.: WO2019/215968
PCT Pub. Date: Nov. 14, 2019

(65) Prior Publication Data
US 2021/0167738 A1 Jun. 3, 2021

(51) Int. Cl.
*H03F 3/45* (2006.01)
*H03F 1/32* (2006.01)
(Continued)

(52) U.S. Cl.
CPC .......... *H03F 1/3211* (2013.01); *H03F 1/302* (2013.01); *H03F 3/16* (2013.01); *H03F 3/193* (2013.01); *H03F 3/45* (2013.01); *H03F 3/45076* (2013.01)

(58) Field of Classification Search
CPC ..... H03F 2200/498; H03F 2203/45318; H03F 2203/45382; H03F 2203/45384; H03F 2203/45392; H03F 2203/45466; H03F 2203/45468; H03F 1/342; H03F 1/3205; H03F 3/45179
(Continued)

(56) References Cited

U.S. PATENT DOCUMENTS 4,489,286 A * 12/1984 Naimpally ............. H03H 11/48
330/303
5,748,048 A    5/1998 Moyal
(Continued)

FOREIGN PATENT DOCUMENTS

EP    0394703 A    10/1990
JP    06-026290     4/1994

OTHER PUBLICATIONS

Extended European Search Report dated May 10, 2021 for corresponding European Application No. 19799996.4.

*Primary Examiner* — Khanh V Nguyen
*Assistant Examiner* — Khiem D Nguyen
(74) *Attorney, Agent, or Firm* — Michael Best & Friedrich LLP

(57) ABSTRACT

Linearity is improved in an amplifier circuit without lowering gain.
The amplifier circuit includes a transistor, a load, an impedance element, and a variable current source. The transistor amplifies an input signal. The load is connected between the transistor and a power supply. The impedance element is connected between the transistor and a ground terminal, and passes a direct current. The variable current source is connected to a connection part between the transistor and the impedance element, and supplies a current in accordance with a voltage of the connection part.

11 Claims, 11 Drawing Sheets

(51) Int. Cl.
*H03F 1/30* (2006.01)
*H03F 3/193* (2006.01)
*H03F 3/16* (2006.01)

(58) Field of Classification Search
USPC .................................. 330/252–261, 296, 285
See application file for complete search history.

(56) References Cited

U.S. PATENT DOCUMENTS 7,876,153 B1   1/2011   Zeller
2008/0211580 A1   9/2008   Bollati et al.

\* cited by examiner

AMPLIFIER CIRCUIT

TECHNICAL FIELD

The present technology relates to an amplifier circuit. Specifically, the present technology relates to an amplifier circuit in which an impedance element for passing a direct current, such as a resistor, is connected to a ground terminal of a transistor.

BACKGROUND ART

In an amplifier circuit, it is preferable that a range in which an output signal is linearly amplified (has linearity) is wide relative to an input signal. Conventionally, in a differential amplifier, for example, a circuit has been proposed in which cross-coupled transistors are inserted to subtract and combine a drain current (for example, see Patent Document 1). In this conventional technology, linearity is improved by performing subtraction to form a flat region because of a characteristic of a transconductance.

CITATION LIST

Patent Document

Patent Document 1: JP H06-026290 B2

SUMMARY OF THE INVENTION

Problems to be Solved by the Invention

In the above-described conventional technology, the cross-coupled transistors are used to subtract and combine a drain current to form a flat region in the characteristic of a transconductance, thereby improving linearity. However, in this conventional technology, there is a side effect that gain is lowered because a current is subtracted. In addition, there is a problem that power consumption increases due to a bias current of the cross-coupled transistors.

The present technology is developed in view of such a situation, and an object of the present technology is to improve linearity without lowering gain in an amplifier circuit.

Solutions to Problems

The present technology has been made to solve the above problems, and a first aspect of the present technology is an amplifier circuit including: a transistor that amplifies an input signal; a load connected between the transistor and a power supply; an impedance element that is connected between the transistor and a ground terminal and passes a direct current; and a variable current source that is connected to a connection part between the transistor and the impedance element and supplies a current in accordance with a voltage of the connection part. This configuration produces an effect of supplementing characteristics of the transistor by supplying the current in accordance with the voltage of the connection part.

In addition, in the first aspect, the transistor may be a MOS transistor that amplifies the input signal input to a gate and outputs the amplified input signal to a drain, the load may be connected to the drain of the transistor, the impedance element may be connected to a source of the transistor, and the variable current source may supply a current in accordance with a source voltage of the transistor to the source of the transistor. This configuration produces an effect of supplementing characteristics of the MOS transistor by supplying the current in accordance with the source voltage.

In addition, in the first aspect, the variable current source may include: an additional transistor having a gate and a drain connected to the connection part; and a resistor connected between a source of the additional transistor and the ground terminal.

In addition, in the first aspect, the variable current source may include: an additional transistor having a drain connected to the connection part; a capacitor connected between the connection part and a gate of the additional transistor; a resistor having one end connected to the gate of the additional transistor; and a bias voltage source connected between another end of the resistor and the ground terminal.

In addition, in the first aspect, the variable current source may supply the current in accordance with the voltage of the connection part in a region where a current supplied by the transistor starts to saturate relative to the input signal. This configuration produces an effect of supplementing, by supplying the current in accordance with the voltage of the connection part, characteristics of the transistor in the region where the current supplied by the transistor starts to saturate.

In addition, in the first aspect, the impedance element may be a resistance element or an inductor element. In addition, in the first aspect, the load may be a resistance element.

In addition, a second aspect of the present technology is an amplifier circuit including: first and second transistors that amplify differential input signals; first and second loads respectively connected between the first and second transistors and a power supply; a current source having one end connected to a ground terminal; first and second impedance elements that are respectively connected between the first and second transistors and another end of the current source and pass a direct current; a first variable current source that has one end connected to a first connection part between the first transistor and the first impedance element and supplies a current in accordance with a voltage of the first connection part; a second variable current source that has one end connected to a second connection part between the second transistor and the second impedance element and supplies a current in accordance with a voltage of the second connection part; a third variable current source that has one end connected to the first connection part and supplies a current in accordance with the voltage of the second connection part; and a fourth variable current source that has one end connected to the second connection part and supplies a current in accordance with the voltage of the first connection part. This configuration produces an effect of supplementing characteristics of the transistor by supplying the current in accordance with the voltage of each connection part of the cross-coupled transistors.

In addition, in the second aspect, each of the first to fourth variable current sources may have another end connected to the another end of the current source. In this case, each of the first to fourth variable current sources may include: an additional transistor having a gate and a drain connected to the connection part; and a resistor connected between a source of the additional transistor and the another end of the current source. In addition, each of the first to fourth variable current sources may include: an additional transistor having a drain connected to the connection part; a capacitor connected between the connection part and a gate of the additional transistor; a resistor having one end connected to the gate of the additional transistor; and a power supply connected between another end of the resistor and the another end of the current source.

In addition, in the second aspect, each of the first to fourth variable current sources may have another end connected to the ground terminal. In this case, each of the first to fourth variable current sources may include: an additional transistor having a gate and a drain connected to the connection part; and a resistor connected between a source of the additional transistor and the ground terminal. In addition, each of the first to fourth variable current sources may include: an additional transistor having a drain connected to the connection part; a capacitor connected between the connection part and a gate of the additional transistor; a resistor having one end connected to the gate of the additional transistor; and a power supply connected between another end of the resistor and the ground terminal.

Effects of the Invention

According to the present technology, it is possible to obtain an excellent effect that linearity can be improved without lowering gain in an amplifier Note that effects described herein are not necessarily limitative, and any of the effects described in the present disclosure may be obtained.

MODE FOR CARRYING OUT THE INVENTION

Hereinafter, a mode for carrying out the present technology (hereinafter referred to as an embodiment) will be described. The description will be given in the following order.
1. First Embodiment (Example of Source Degeneration Amplifier)
2. Second Embodiment (Example of Differential Amplifier)
3. Modification 1. First Embodiment

Figure 1:
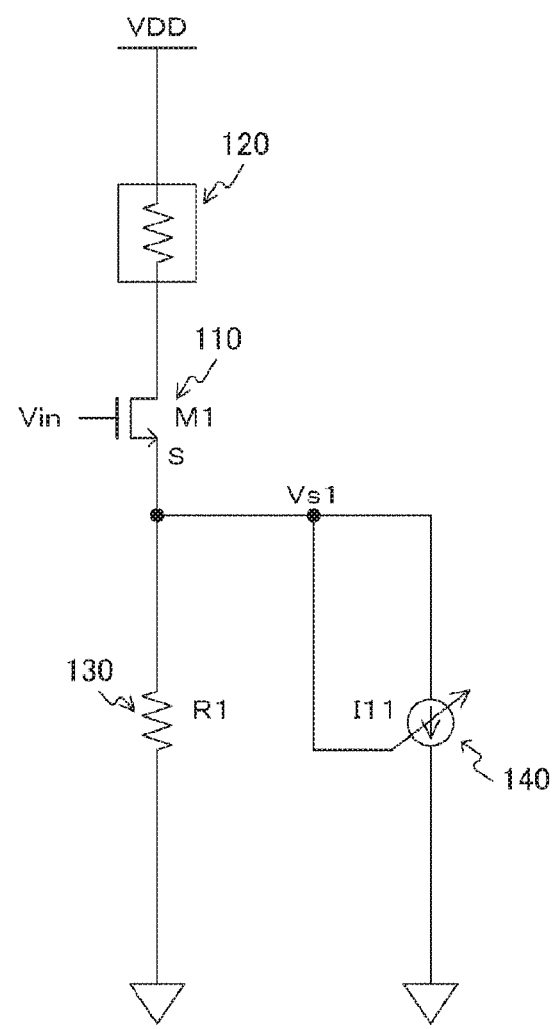
FIG. 1 is a diagram illustrating a circuit configuration example of a source degeneration amplifier according to a first embodiment of the present technology.

[Circuit Configuration of Source Degeneration Amplifier]
FIG. 1 is a diagram illustrating a circuit configuration example of a source degeneration amplifier according to a first embodiment of the present technology.

The source degeneration amplifier is an amplifier circuit that amplifies an input voltage Vin. The source degeneration amplifier includes a transistor 110 (M1), a load resistor 120, a degeneration resistor 130 (R1), and a variable current source 140 (I11).

The transistor 110 is a metal-oxide-semiconductor (MOS) transistor. The input voltage Vin is input to a gate of the transistor 110. A drain of the transistor 110 is connected to a power supply VDD via the load resistor 120. The drain of the transistor 110 serves as an output of the source degeneration amplifier. Note that, although an example using the MOS transistor is described here, the present technology can also be applied to a bipolar transistor. In addition, although an example in which the load resistor 120 is connected to the drain of the transistor 110 is described, an inductor element may be used as a load instead of the load resistor 120.

In addition, the degeneration resistor 130 is connected to a source of the transistor 110. The degeneration resistor 130 is an impedance element that generates a voltage proportional to the input voltage Vin to the gate of the transistor 110, and is used to reduce distortion of gain (gain) as the amplifier circuit. It is known that the degeneration resistor 130 has a characteristic of lowering a transconductance and increasing an output resistance.

Note that, in a case where a high frequency operation is assumed, an inductor element (coil) may be provided instead of the degeneration resistor 130 serving as a resistance element. Although a loss occurs in the resistance element, such a loss can be avoided in the inductor element. On the other hand, although an impedance changes in the inductor element depending on a frequency, a broadband characteristic can be obtained in the resistance element independent of a frequency. Thus, it is desirable to appropriately select, as the impedance element for passing a direct current, the resistance element or the inductor element. In addition, the resistance element and the inductor element may be connected in parallel.

The variable current source 140 is a variable current source that is connected to the source of the transistor 110 and supplies a current in accordance with a source voltage Vs1 to the transistor 110. That is, the current supplied from the variable current source 140 is controlled by the source voltage Vs1 of the transistor 110.

Note that the load resistor 120 is an example of a load described in the claims. In addition, the degeneration resistor 130 is an example of an impedance element described in the claims.

Figure 2:
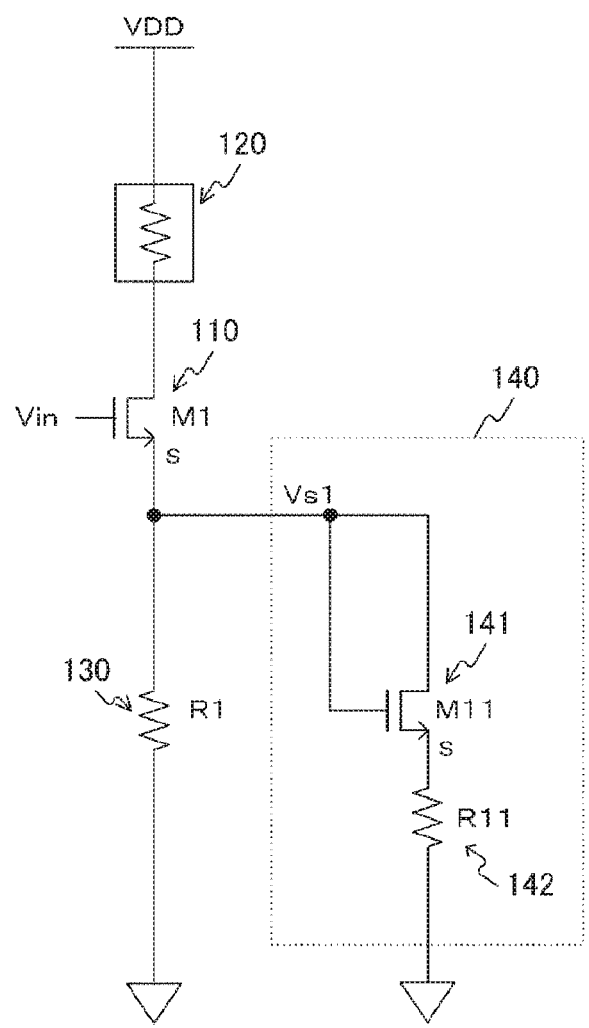
FIG. 2 is a diagram illustrating a first specific example of a variable current source 140 in the source degeneration amplifier according to the first embodiment of the present technology.

FIG. 2 is a diagram illustrating a first specific example of the variable current source 140 in the source degeneration amplifier according to the first embodiment of the present technology.

The first specific example of the variable current source 140 includes a transistor 141 (M11) and a resistor 142 (R11). A gate and a drain of the transistor 141 are connected to the source of the transistor 110. In addition, the resistor 142 is connected to a source of the transistor 141. Note that the transistor 141 is an example of an additional transistor described in the claims.

A source voltage of the transistor 110 is input to the gate of the transistor 141. A source voltage of the transistor 141 is a voltage of the resistor 142. That is, the source voltage of the transistor 141 is at a ground level in a state where no current flows through the transistor 141. Then, when a current flows through the transistor 141, a voltage having a value obtained by multiplying the current by a resistance value R11 of the resistor 142 serves as the source voltage of the transistor 141. As a result, a current in accordance with a gate-source voltage of the transistor 141 flows to the drain of the transistor 141 and is supplied to the transistor 110.

In this way, in the first specific example, a threshold voltage is adjusted by connecting the resistor 142 to the source of the transistor 141.

Figure 3:
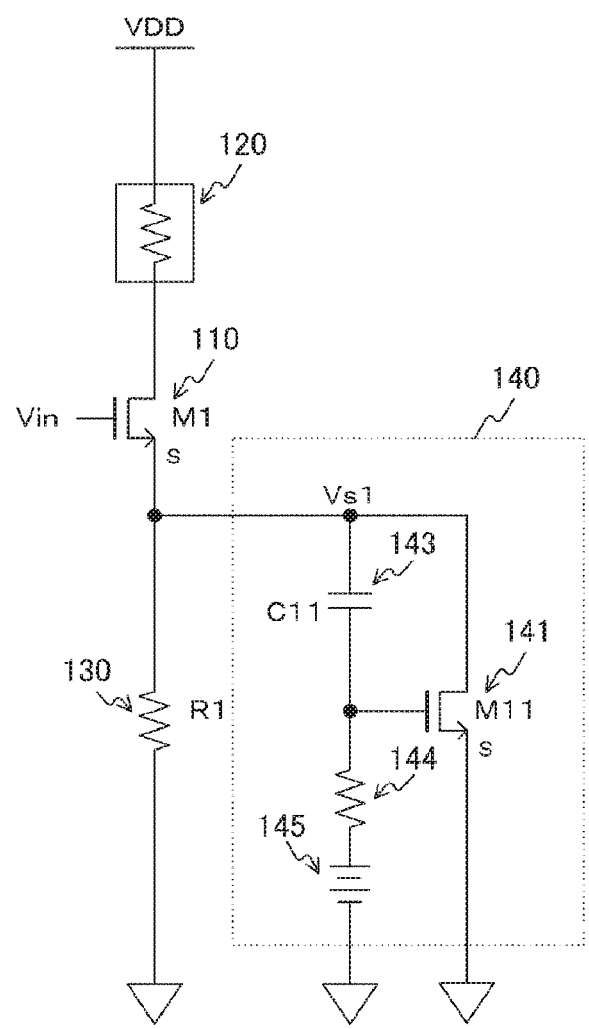
FIG. 3 is a diagram illustrating a second specific example of the variable current source 140 in the source degeneration amplifier according to the first embodiment of the present technology.

FIG. 3 is a diagram illustrating a second specific example of the variable current source 140 in the source degeneration amplifier according to the first embodiment of the present technology.

The second specific example of the variable current source 140 includes the transistor 141 (M11), a capacitor 143 (C11), a resistor 144, and a bias voltage source 145. The drain of the transistor 141 is connected to the source of the transistor 110. In addition, the gate of the transistor 141 is connected to the source of the transistor 110 via the capacitor 143. In addition, the gate of the transistor 141 is connected to the bias voltage source 145 via the resistor 144.

A class B or class C bias voltage is applied to the gate of the transistor 141 by the bias voltage source 145, and when a large signal is input, a current starts to flow through the gate. In addition, a direct current component of a signal input to the gate of the transistor 141 is cut by the capacitor 143. As a result, a current in accordance with a gate-source voltage of the transistor 141 flows to the drain of the transistor 141 and is supplied to the transistor 110.

In this way, in the second specific example, a threshold voltage is adjusted by connecting the bias voltage source 145 to the gate of the transistor 141 and applying a class B or class C bias voltage to the gate. Note that the resistor 144 connected to the gate of the transistor 141 has a high resistance and does not contribute to the adjustment of the threshold voltage.

[Current Characteristics of Transistor]

Figure 4:
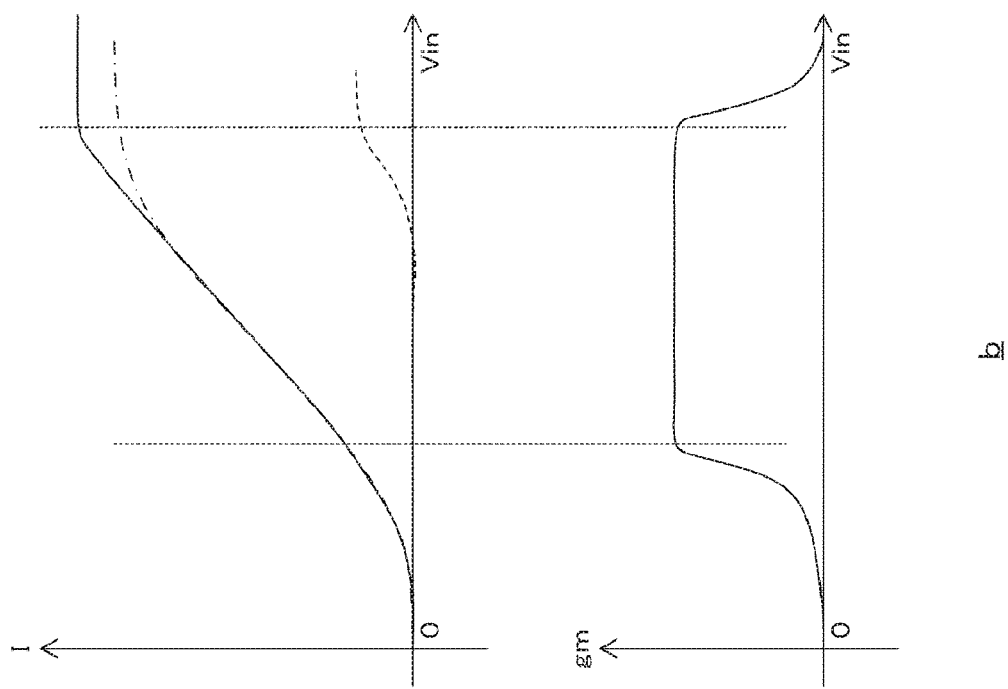
FIG. 4 is a diagram illustrating examples of current characteristics of a transistor 110 according to the first embodiment of the present technology.
Figure 4:
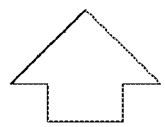
Figure 4:
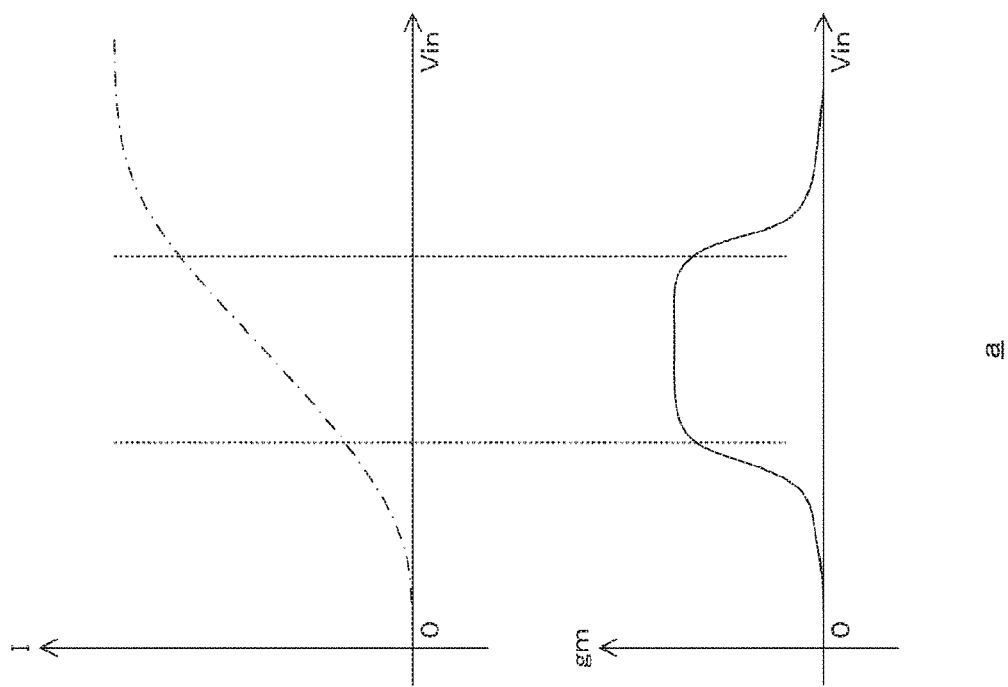

FIG. 4 is a diagram illustrating examples of current characteristics of the transistor 110 according to the first embodiment of the present technology.

In FIG. 4, a indicates a current characteristic of the transistor 110 in a case where the variable current source 140 is not provided. When the input voltage Vin is increased, a current I driven by the transistor 110 saturates and linearity deteriorates. Thus, in this embodiment, the saturation of the current characteristic is suppressed by connecting the variable current source 140 controlled by the source voltage Vs1 to the source of the transistor 110. When a current of the transistor 110 increases, the source voltage Vs1 increases.

The variable current source 140 is set to start flowing a current when the source voltage Vs1 exceeds a certain threshold.

In FIG. 4, b indicates a current characteristic of the transistor 110 in a case where the variable current source 140 is provided. An alternate long and short dash line indicates a current driven by the transistor 110 in the case of a of FIG. 4 where the variable current source 140 is not provided. In addition, a dotted line indicates a current driven by the variable current source 140. Thus, in the case where the variable current source 140 is provided, both currents are added, and a current flowing through the transistor 110 is as indicated by a solid line.

Here, a transconductance gm is indicated in order to examine linearity of the current characteristics. The transconductance gm is a differential value of a current, and it is indicated that a voltage-current characteristic is linear in a region where the transconductance gm shows a constant value. In addition, when the transconductance gm is high, it is indicated that a voltage-current slope becomes steep and gain is high.

In the case where the variable current source 140 is provided, even if the input voltage Vin is increased, a current does not saturate until the input voltage Vin reaches a certain level, compared with the case where the variable current source 140 is not provided. That is, it can be seen that a linear region in which a waveform of the transconductance gm is flat expands by causing the current of the variable current source 140 to start flowing with the current saturation of the transistor 110. That is, it is possible to increase a region that is linearly driven without reducing gain as an amplifier circuit.

A current to be flown by the variable current source 140 is determined by a manner of saturation of a current driven only by the transistor 110. In an actual design, conditions such as a capability of a transistor used and a range of a voltage used are different. Thus, design options can be expanded by applying this embodiment.

As described above, according to the first embodiment of the present technology, it is possible to expand a region that is linearly driven without lowering gain by connecting the variable current source 140 to the source of the transistor 110 in the source degeneration amplifier.

2. Second Embodiment

[Circuit Configuration of Differential Amplifier]

Figure 5:
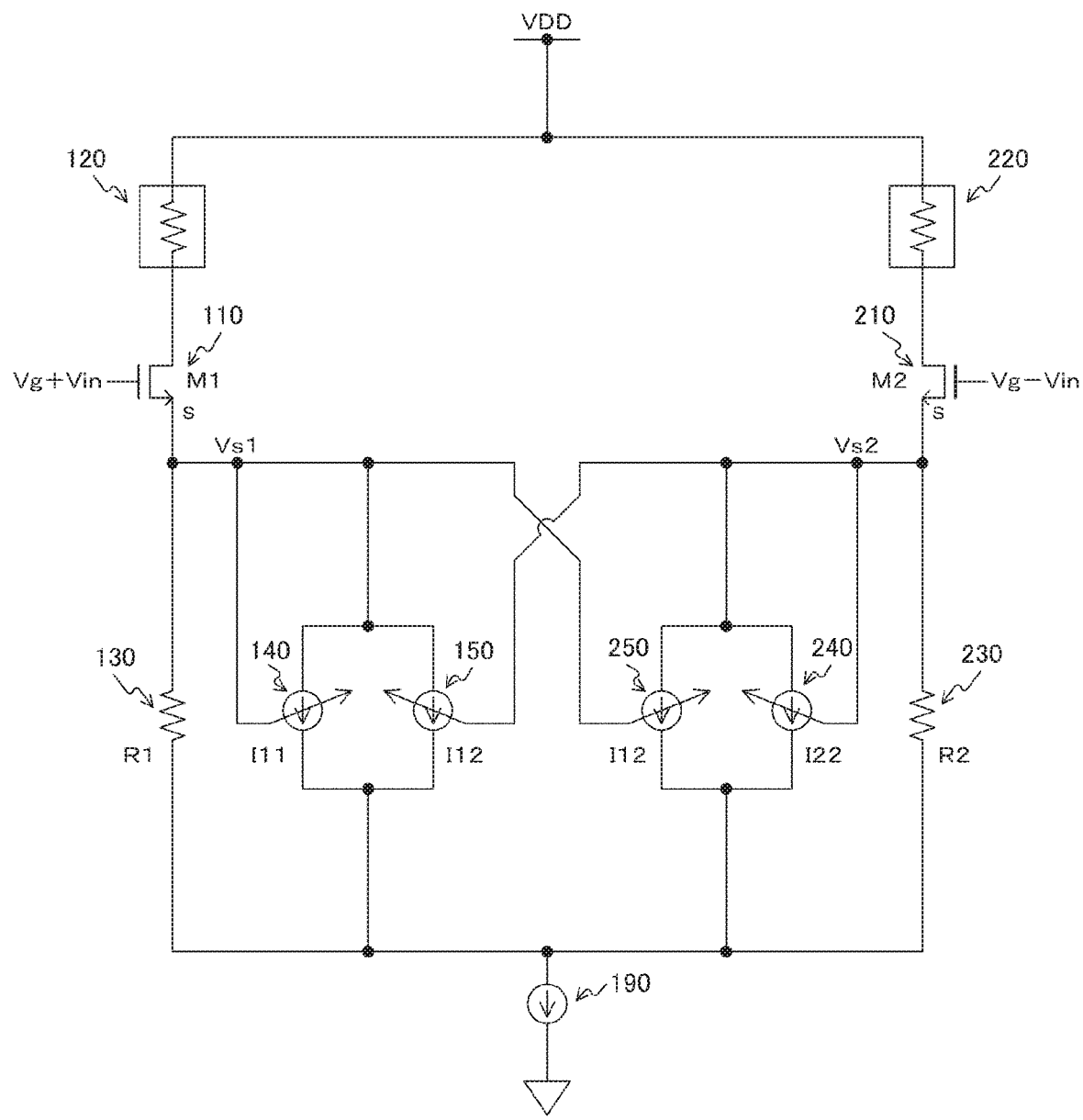
FIG. 5 is a diagram illustrating a circuit configuration example of a differential amplifier according to a second embodiment of the present technology.

FIG. 5 is a diagram illustrating a circuit configuration example of a differential amplifier according to a second embodiment of the present technology.

The differential amplifier is an amplifier circuit that combines the source degeneration amplifiers according to the above-described first embodiment and causes the combined source degeneration amplifiers to perform a differential operation. That is, a voltage obtained by adding an input voltage Vin to a gate voltage Vg is applied to a positive side transistor 110, and a voltage obtained by subtracting the input voltage Vin from the gate voltage Vg is applied to a negative side transistor 210.

As in the above-described first embodiment, a load resistor 120, a degeneration resistor 130, and a variable current source 140 are connected to the positive side transistor 110. In addition, a variable current source 150 (I12) is connected in parallel with the variable current source 140. The variable current source 150 is connected to flow a current through a source of the transistor 110 similarly to the variable current source 140, but is controlled by a source voltage Vs2 of the transistor 210. That is, the variable current source 150 supplies a current in accordance with the source voltage Vs2 of the transistor 210 to the source of the transistor 110.

Similarly to the positive side transistor 110, a load resistor 220, a degeneration resistor 230, and variable current sources 240 and 250 are connected to the negative side transistor 210. The variable current source 250 is connected to flow a current through a source of the transistor 210 similarly to the variable current source 240, but is controlled by a source voltage Vs1 of the transistor 110. That is, the variable current source 250 supplies a current in accordance with the source voltage Vs1 of the transistor 110 to the source of the transistor 210.

That is, the variable current sources 150 and 250 causes the transistors 110 and 210 to operate as cross-coupled transistors. As a result, since the transistor to which a signal in a reverse phase is input is driven, and a current is canceled, a transconductance gm is inversely subtracted and becomes a constant value, and thus linearity is improved.

In addition, in the differential amplifier according to the second embodiment, the degeneration resistors 130 and 230 and the variable current sources 140, 150, 240, and 250 are connected to a current source 190.

Note that the transistors 110 and 210 are examples of first and second transistors described in the claims. In addition, the load resistors 120 and 220 are examples of first and second loads described in the claims. In addition, the degeneration resistors 130 and 230 are examples of first and second impedance elements described in the claims. In addition, the variable current sources 140, 240, 150, and 250 are examples of first to fourth variable current sources described in the claims.

Figure 6:
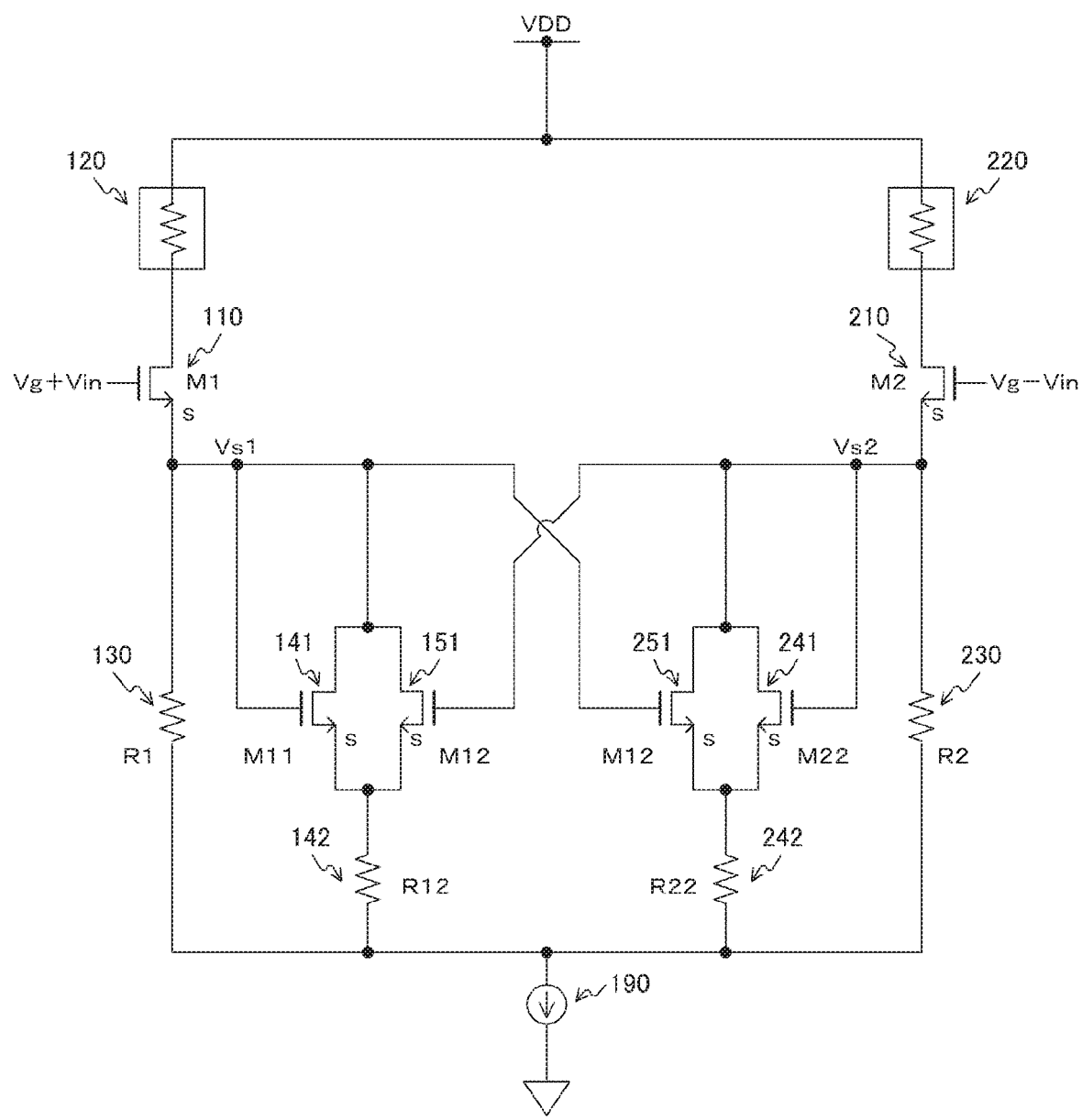
FIG. 6 is a diagram illustrating a first specific example of variable current sources 140, 150, 240, and 250 in the differential amplifier according to the second embodiment of the present technology.

FIG. 6 is a diagram illustrating a first specific example of the variable current sources 140, 150, 240, and 250 in the differential amplifier according to the second embodiment of the present technology.

As in the above-described first embodiment, the first specific example of the second embodiment includes a transistor 141 and a resistor 142 as the variable current source 140. In addition, as the variable current source 150, a transistor 151 is connected in parallel with the transistor 141. In addition, as the variable current source 240, a transistor 241 and a resistor 242 are provided. In addition, as the variable current source 250, a transistor 251 is connected in parallel with the transistor 241.

Note that each of the transistors 141, 151, 241, and 251 is an example of an additional transistor described in the claims.

Figure 7:
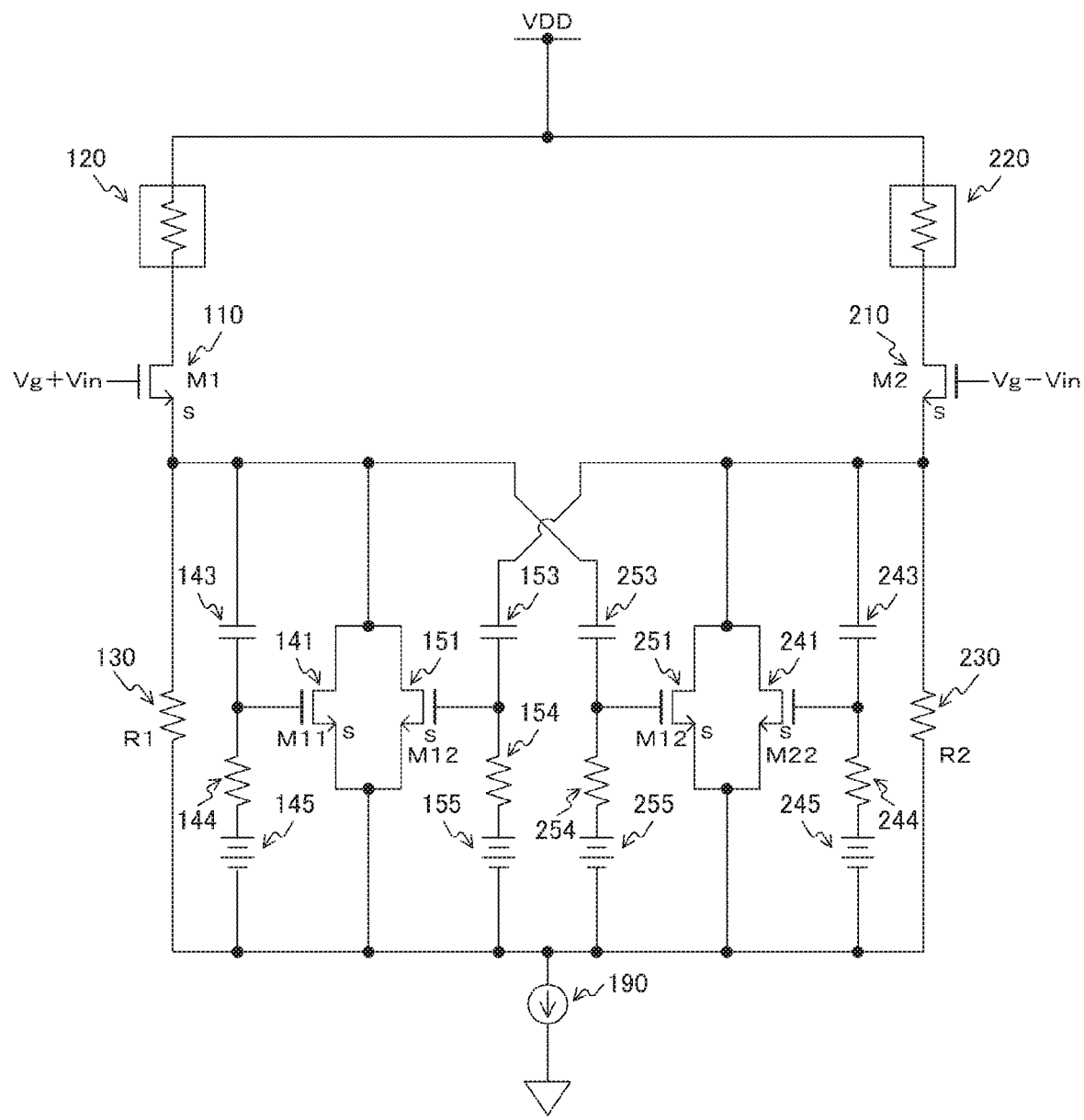
FIG. 7 is a diagram illustrating a second specific example of the variable current sources 140, 150, 240, and 250 in the differential amplifier according to the second embodiment of the present technology.

FIG. 7 is a diagram illustrating a second specific example of the variable current sources 140, 150, 240, and 250 in the differential amplifier according to the second embodiment of the present technology.

As in the above-described first embodiment, the second specific example of the second embodiment includes the transistor 141, a capacitor 143, a resistor 144, and a bias voltage source 145 as the variable current source 140. In addition, as the variable current source 150, the transistor 151, a capacitor 153, a resistor 154, and a bias voltage source 155 are provided. In addition, as the variable current source 240, the transistor 241, a capacitor 243, a resistor 241, and a bias voltage source 245 are provided. In addition, as the variable current source 250, the transistor 251, a capacitor 253, a resistor 254, and a bias voltage source 255 are provided.

[Current Characteristics of Transistor]

Figure 8:
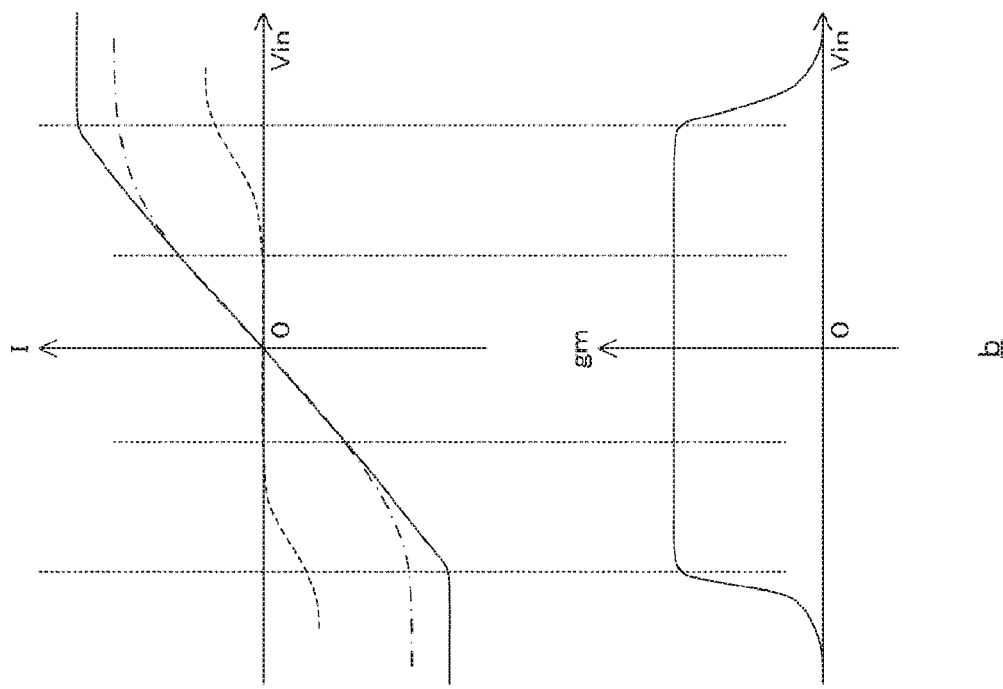
FIG. 8 is a diagram illustrating examples of current characteristics of a transistor 110 according to the second embodiment of the present technology.
Figure 8:
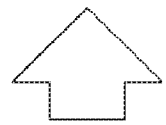
Figure 8:
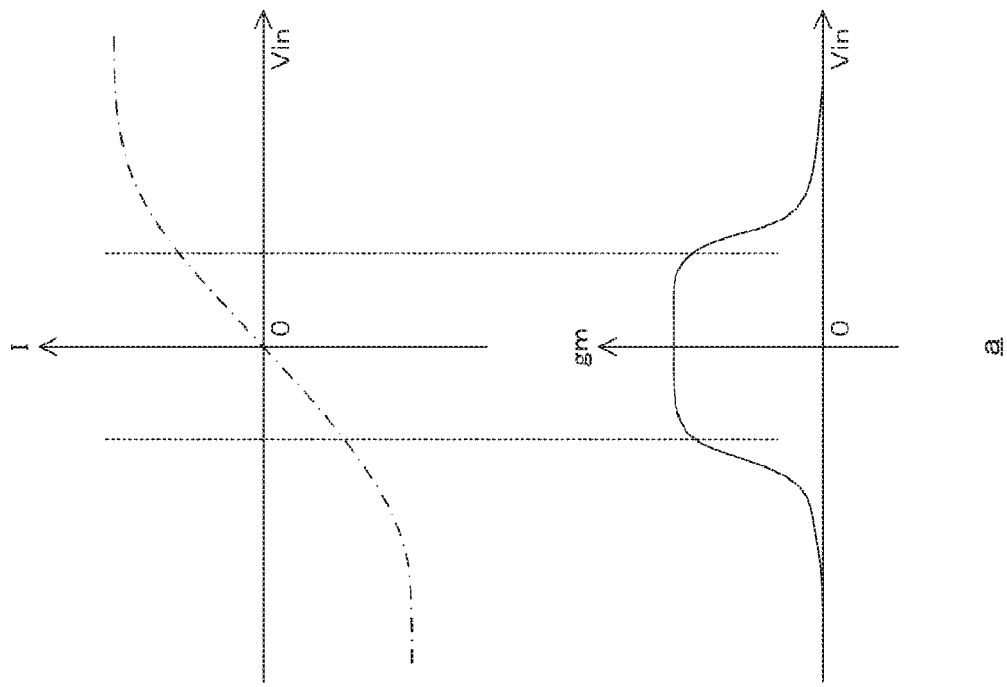

FIG. 8 is a diagram illustrating examples of current characteristics of the transistor 110 according to the second embodiment of the present technology.

In FIG. 8, a indicates a current characteristic of the transistor 110 in a case where the variable current sources 140 and 150 are not provided. When the input voltage Vin is away from 0 V, a current saturates and linearity deteriorates. The saturation of the current characteristic suppressed by connecting the variable current source 140 controlled by the source voltage Vs1 and the variable current source 150 controlled by the source voltage Vs2 to the source of the transistor 110.

In FIG. 8, b indicates a current characteristic of the transistor 110 in a case where the variable current sources 140 and 150 are provided. An alternate long and short dash line indicates a current driven by the transistor 110 in the case of a of FIG. 8 where the variable current sources 140 and 150 are not provided. In addition, a dotted line indicates a current driven by the variable current sources 140 and 150. Thus, in the case where the variable current sources 140 and 150 are provided, these currents are added, and a current flowing through the transistor 110 is as indicated by a solid line.

A case where the input voltage Vin is applied to a positive side is considered. When a current of the transistor 110 increases, the source voltage Vs1 increases. The variable current source 140 is set to start flowing a current when the source voltage Vs1 exceeds a certain threshold. A linear region in which the transconductance gm is flat is increased by causing the current of the variable current source 140 to start flowing with the current saturation of the transistor 110.

On the other hand, a case where the input voltage Vin is applied to a negative side is considered. When a current of the transistor 210 increases, the source voltage Vs2 increases. The variable current source 150 is set to start flowing a current when the source voltage Vs2 exceeds a certain threshold. A linear region in which the transconductance gm is flat is increased by causing the current of the variable current source 150 to start flowing with the current saturation of the transistor 110.

Note that although the description has been given here by focusing on the current characteristics of the transistor 110, the same applies to current characteristics of the transistor 210.

As described above, in the second embodiment of the present technology, in the differential amplifier, the variable current sources 140 and 150 are connected to the source of the transistor 110 and the variable current sources 240 and 250 are connected to the source of the transistor 210. With this configuration, it is possible to expand a region that is linearly driven without reducing gain.

3. Modification

[Circuit Configuration of Differential Amplifier]

Figure 9:
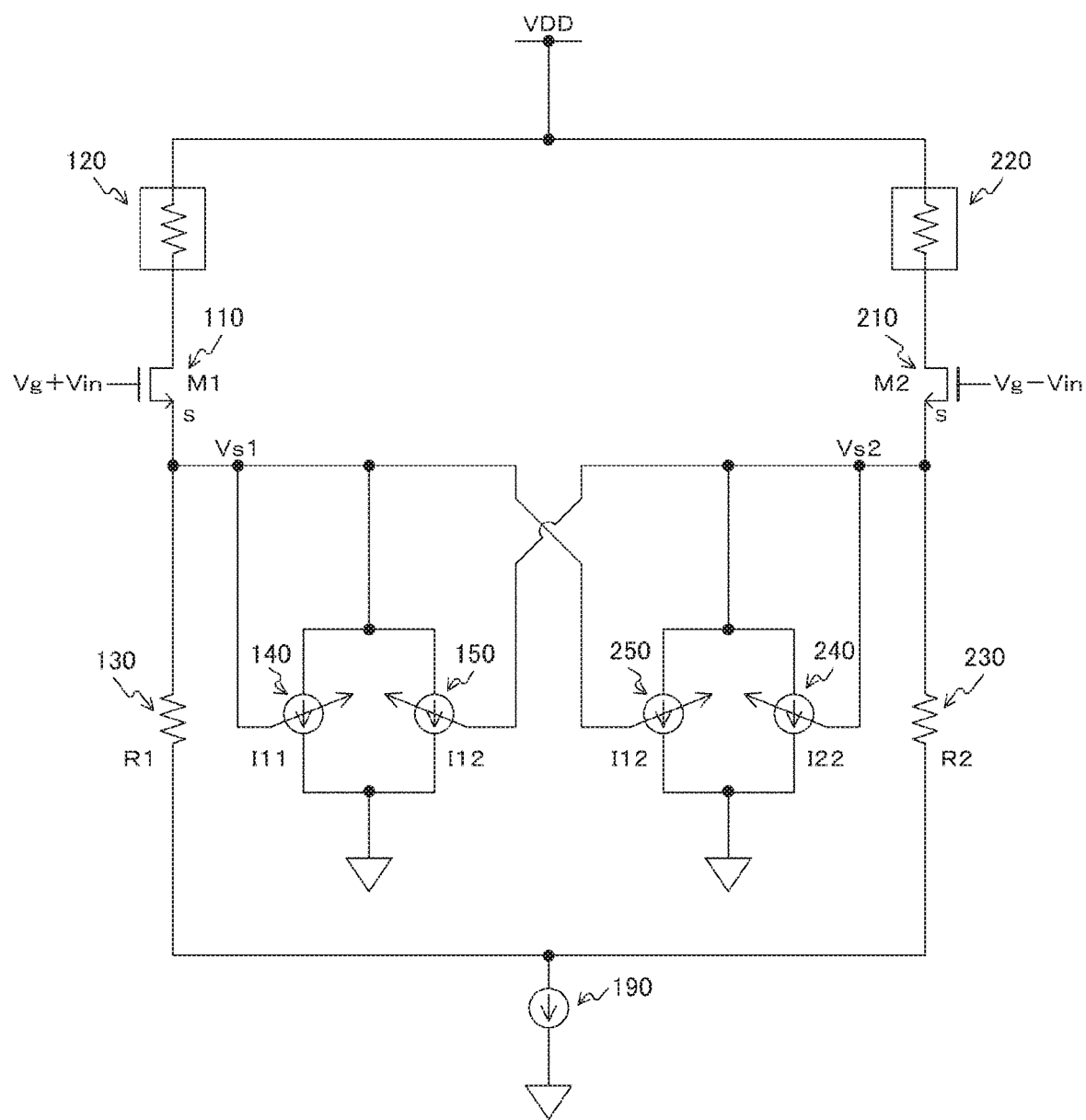
FIG. 9 is a diagram illustrating a modification of the differential amplifier according to the second embodiment of the present technology.

FIG. 9 is a diagram illustrating a modification of the differential amplifier according to the second embodiment of the present technology.

Although the variable current sources 140, 150, 240, and 250 are connected to the current source 190 in the above-described differential amplifier according to the second embodiment, they are grounded in this modification.

Figure 10:
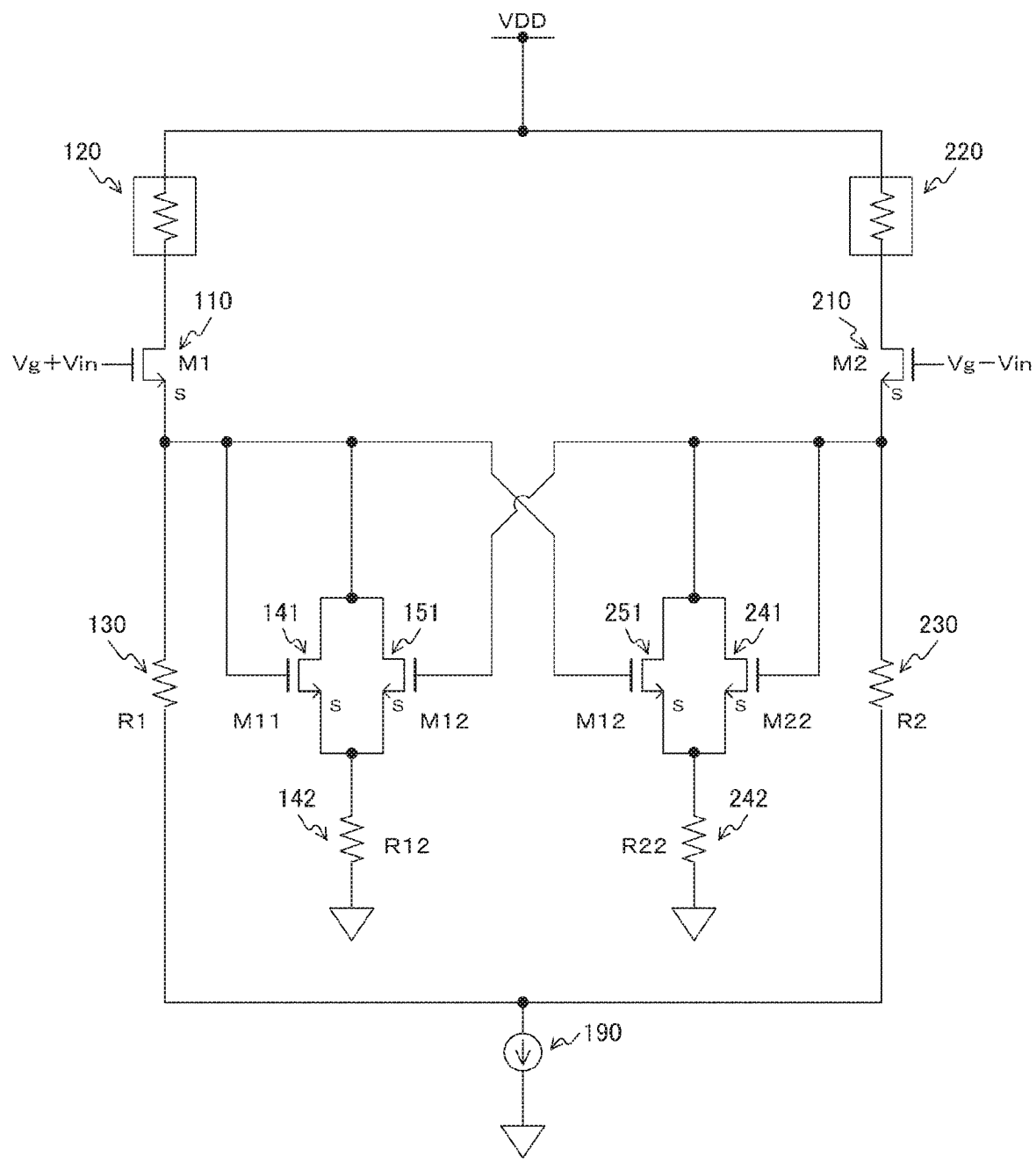
FIG. 10 is a diagram illustrating a first specific example of the variable current sources 140, 150, 240, and 250 in the modification of the differential amplifier according to the second embodiment of the present technology.

FIG. 10 is a diagram illustrating a first specific example of the variable current sources 140, 150, 240, and 250 in the modification of the differential amplifier according to the second embodiment of the present technology.

The first specific example of this modification has a similar configuration to the above-described first specific example of the second embodiment, but is different in that the resistors 142 and 242 are grounded.

Figure 11:
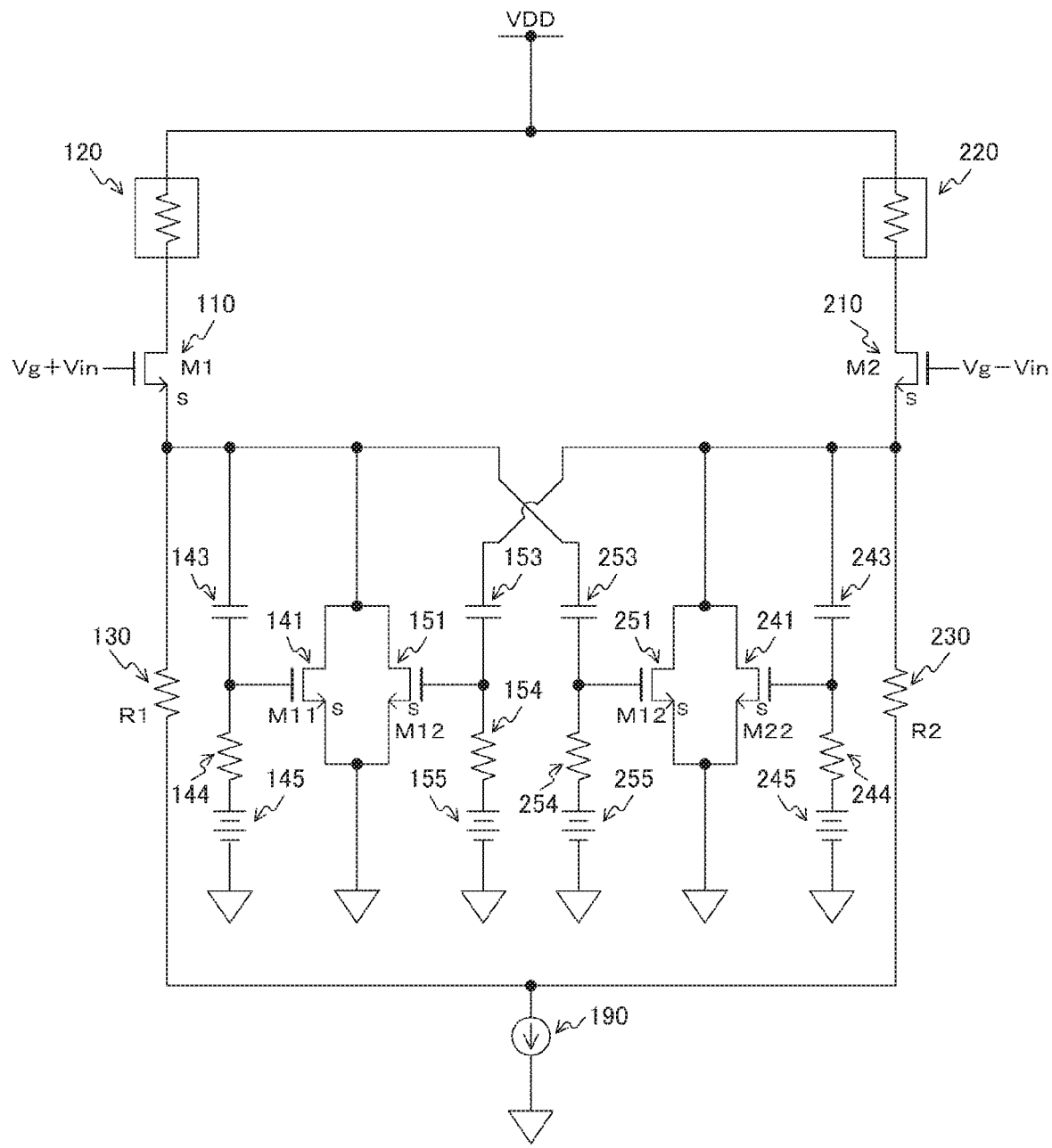
FIG. 11 is a diagram illustrating a second specific example of the variable current sources 140, 150, 240, and 250 in the modification of the differential amplifier according to the second embodiment of the present technology.

FIG. 11 is a diagram illustrating a second specific example of the variable current sources 140, 150, 240, and 250 in the modification of the differential amplifier according to the second embodiment of the present technology.

The second specific example of this modification has a similar configuration to the above-described second specific example of the second embodiment. However, the second specific example of this modification is different in that the transistors 141, 151, 241, and 251 and the bias voltage sources 145, 155, 245, and 255 are grounded.

As described above, according to the embodiments of the present technology, it is possible to expand a region that is linearly driven without reducing gain in an amplifier circuit.

With increase in communication capacity, the number of communication systems with a high peak-to-average power ratio (PAPR), such as long term evolution (LTE) and a TV tuner, is expected to increase. Since the increase in PAPR affects the maximum input sensitivity of a receiver, an amplifier with a wider dynamic range is required. In this embodiment, a region in which the transconductance gm is flat can be expanded without reducing gain, which contributes to lower power consumption of a highly linear receiver that requires high gain. Furthermore, the transistor inserted to improve linearity does not consume a direct current, but consumes a current only when a signal having a large amplitude is input, so that power consumption does not increase in a standby state or when a small signal is received, thereby contributing to lower power consumption of the receiver.

Note that the above-described embodiments indicate examples for embodying the present technology, and the matters in the embodiments and the matters specifying the invention in the claims have a correspondence relationship. Similarly, the matters specifying the invention in the claims and the matters having the same names in the embodiments of the present technology have a correspondence relationship. However, the present technology is not limited to the embodiments and can be embodied by making various modifications to the embodiments without departing from the gist of the present technology.

Note that the effects described in the present specification are merely examples and are not limitative, and other effects may be achieved.

Note that the present technology can also include the following configurations.

(1) An amplifier circuit including:
a transistor that amplifies an input signal;
a load connected between the transistor and a power supply;
an impedance element that is connected between the transistor and a ground terminal and passes a direct current; and
a variable current source that is connected to a connection part between the transistor and the impedance element and supplies a current in accordance with a voltage of the connection part.

(2) The amplifier circuit according to (1), in which
the transistor is a MOS transistor that amplifies the input signal input to a gate and outputs the amplified input signal to a drain,
the load is connected to the drain of the transistor,
the impedance element is connected to a source of the transistor, and
the variable current source supplies a current in accordance with a source voltage of the transistor to the source of the transistor.

(3) The amplifier circuit according to (1) or (2), in which
the variable current source includes:
an additional transistor having a gate and a drain connected to the connection part; and
a resistor connected between a source of the additional transistor and the ground terminal.

(4) The amplifier circuit according to (1) or (2), in which
the variable current source includes:
an additional transistor having a drain connected to the connection part;
a capacitor connected between the connection part and a gate of the additional transistor;
a resistor having one end connected to the gate of the additional transistor; and
a bias voltage source connected between another end of the resistor and the ground terminal.

(5) The amplifier circuit according to any one of (1) to (4), in which
the variable current source supplies the current in accordance with the voltage of the connection part in a region where a current supplied by the transistor starts to saturate relative to the input signal.

(6) The amplifier circuit according to any one of (1) to (5), in which
the impedance element is a resistance element.

(7) The amplifier circuit according to any one of (1) to (5), in which
the impedance element is an inductor element.

(8) The amplifier circuit according to any one of (1) to (7), in which
the load is a resistance element.

(9) An amplifier circuit including:
first and second transistors that amplify differential input signals;
first and second loads respectively connected between the first and second transistors and a power supply;
a current source having one end connected to a ground terminal;
first and second impedance elements that are respectively connected between the first and second transistors and another end of the current source and pass a direct current;
a first variable current source that has one end connected to a first connection part between the first transistor and the first impedance element and supplies a current in accordance with a voltage of the first connection part;
a second variable current source that has one end connected to a second connection part between the second transistor and the second impedance element and supplies a current in accordance with a voltage of the second connection part;
a third variable current source that has one end connected to the first connection part and supplies a current in accordance with the voltage of the second connection part; and
a fourth variable current source that has one end connected to the second connection part and supplies a current in accordance with the voltage of the first connection part.

(10) The amplifier circuit according to (9), in which
each of the first to fourth variable current sources has another end connected to the another end of the current source.

(11) The amplifier circuit according to (9) or (10), in which
each of the first to fourth variable current sources includes:
an additional transistor having a gate and a drain connected to the connection part; and a resistor connected between a source of the additional transistor and the another end of the current source.

(12) The amplifier circuit according to (9) or (10), in which
each of the first to fourth variable current sources includes:
an additional transistor having a drain connected to the connection part;
a capacitor connected between the connection part and a gate of the additional transistor;
a resistor having one end connected to the gate of the additional transistor; and
a power supply connected between another end of the resistor and the another end of the current source.

(13) The amplifier circuit according to (9), in which
each of the first to fourth variable current sources has another end connected to the ground terminal.

(14) The amplifier circuit according to (9) or (13), in which
each of the first to fourth variable current sources includes:
an additional transistor having a gate and a drain connected to the connection part; and
a resistor connected between a source of the additional transistor and the ground terminal.

(15) The amplifier circuit according to (9) or (13), in which
each of the first to fourth variable current sources includes:
an additional transistor having a drain connected to the connection part;
a capacitor connected between the connection part and a gate of the additional transistor;
a resistor having one end connected to the gate of the additional transistor; and
a power supply connected between another end of the resistor and the ground terminal.

REFERENCE SIGNS LIST 110, 210 Transistor
120, 220 Load resistor
130, 230 Degeneration resistor
140, 150, 240, 250 Variable current source
141, 151, 241, 251 Transistor
142, 144, 154, 242, 244, 254 Resistor
143, 153, 243, 253 Capacitor
145, 155, 245, 255 Bias voltage source
190 Current source

The invention claimed is:
1. An amplifier circuit comprising:
a transistor that amplifies an input signal;
a load connected between the transistor and a power supply;
an impedance element that is connected between the transistor and a ground terminal and passes a direct current; and
a variable current source that is connected to a connection part between the transistor and the impedance element and supplies a current in accordance with a voltage of the connection part, the variable current source including:
an additional transistor having a drain connected to the connection part,
a capacitor connected between the connection part and a gate of the additional transistor,
a resistor having one end connected to the gate of the additional transistor, and
a bias voltage source connected between another end of the resistor and the ground terminal.

2. The amplifier circuit according to claim 1, wherein
the variable current source supplies the current in accordance with the voltage of the connection part in a region where a current supplied by the transistor starts to saturate relative to the input signal.

3. The amplifier circuit according to claim 1, wherein
the impedance element is a resistance element.

4. The amplifier circuit according to claim 1, wherein
the impedance element is an inductor element.

5. The amplifier circuit according to claim 1, wherein
the load is a resistance element.

6. An amplifier circuit comprising:
first and second transistors that amplify differential input signals;
first and second loads respectively connected between the first and second transistors and a power supply;
a current source having one end connected to a ground terminal;
first and second impedance elements that are respectively connected between the first and second transistors and another end of the current source and pass a direct current;
a first variable current source that has one end connected to a first connection part between the first transistor and the first impedance element and supplies a current in accordance with a voltage of the first connection part;
a second variable current source that has one end connected to a second connection part between the second transistor and the second impedance element and supplies a current in accordance with a voltage of the second connection part;
a third variable current source that has one end connected to the first connection part and supplies a current in accordance with the voltage of the second connection part; and
a fourth variable current source that has one end connected to the second connection part and supplies a current in accordance with the voltage of the first connection part, wherein
each of the first to fourth variable current sources has another end connected to the another end of the current source.

7. The amplifier circuit according to claim 6, wherein
each of the first to fourth variable current sources includes:
an additional transistor having a gate and a drain connected to the connection part; and
a resistor connected between a source of the additional transistor and the another end of the current source.

8. The amplifier circuit according to claim 6, wherein
each of the first to fourth variable current sources includes:
an additional transistor having a drain connected to the connection part;
a capacitor connected between the connection part and a gate of the additional transistor;
a resistor having one end, connected to the gate of the additional transistor; and
a power supply connected between another end of the resistor and the another end of the current source.

9. The amplifier circuit according to claim 6, wherein
each of the first to fourth variable current sources has the another end connected to the ground terminal.

10. The amplifier circuit according to claim 6, wherein each of the first to fourth variable current sources includes:
   an additional transistor having a gate and a drain connected to the connection part; and
   a resistor connected between a source of the additional transistor and the ground terminal.

11. The amplifier circuit according to claim 6, wherein each of the first to fourth variable current sources includes:
   an additional transistor having a drain connected to the connection part;
   a capacitor connected between the connection part and a gate of the additional transistor;
   a resistor having one end connected to the gate of the additional transistor; and
   a power supply connected between another end of the resistor and the ground terminal.

\* \* \* \* \*

UNITED STATES PATENT AND TRADEMARK OFFICE
CERTIFICATE OF CORRECTION

| | |
|---|---|
| PATENT NO. | : 11,368,129 B2 |
| APPLICATION NO. | : 17/052373 |
| DATED | : June 21, 2022 |
| INVENTOR(S) | : Yoshikatsu Jingu |

It is certified that error appears in the above-identified patent and that said Letters Patent is hereby corrected as shown below:

On the Title Page

Item (30) FOREIGN APPLICATION PRIORITY DATA:
Please add "May 10, 2019 (JP)................JP2018-091643,"

Signed and Sealed this
Eighteenth Day of October, 2022

Katherine Kelly Vidal
*Director of the United States Patent and Trademark Office*